United States Patent [19]
Usami et al.

[11] Patent Number: 5,392,306
[45] Date of Patent: Feb. 21, 1995

[54] MULTIPLE QUANTUM WELL STRUCTURE AND SEMICONDUCTOR DEVICE USING THE SAME

[75] Inventors: Masashi Usami, Tokyo; Yuichi Matsushima, Tokorozawa, both of Japan

[73] Assignee: Kokusai Denshin Denwa Kabushiki Kaisha, Tokyo, Japan

[21] Appl. No.: 79,618

[22] Filed: Jun. 18, 1993

[30] Foreign Application Priority Data

Jun. 29, 1992 [JP] Japan .................................. 4-192830

[51] Int. Cl.⁶ ........................ H01S 3/18; H01L 31/06
[52] U.S. Cl. ...................................... 372/45; 257/14; 257/101
[58] Field of Search ............... 372/45, 44, 46; 257/12, 257/13, 14, 15, 16, 101

[56] References Cited

U.S. PATENT DOCUMENTS 4,701,774 10/1987 McIlroy et al. .................. 257/13

5,172,384 12/1992 Goronkin et al. .................. 372/45

Primary Examiner—Georgia Y. Epps
Assistant Examiner—Robert McNutt
Attorney, Agent, or Firm—Emmanuel J. Lobato

[57] ABSTRACT

A multiple quantum well structure which permits substantially uniform injection of carriers from the outside into respective quantum well layers of the multiple quantum well and a semiconductor device employing such a multiple quantum well structure. A multiple quantum well structure is formed by laminating at least two pairs of quantum well layers each having a thickness substantially equal to the de Broglie's wave-length of electrons and barrier layers of an energy gap greater than that of the quantum well layers, and the multiple quantum well structure is doped with at least one of p-type and n-type impurities in a manner to slope the energy band of the entire multiple quantum well structure so that carriers injected thereinto are distributed uniformly throughout it.

3 Claims, 8 Drawing Sheets

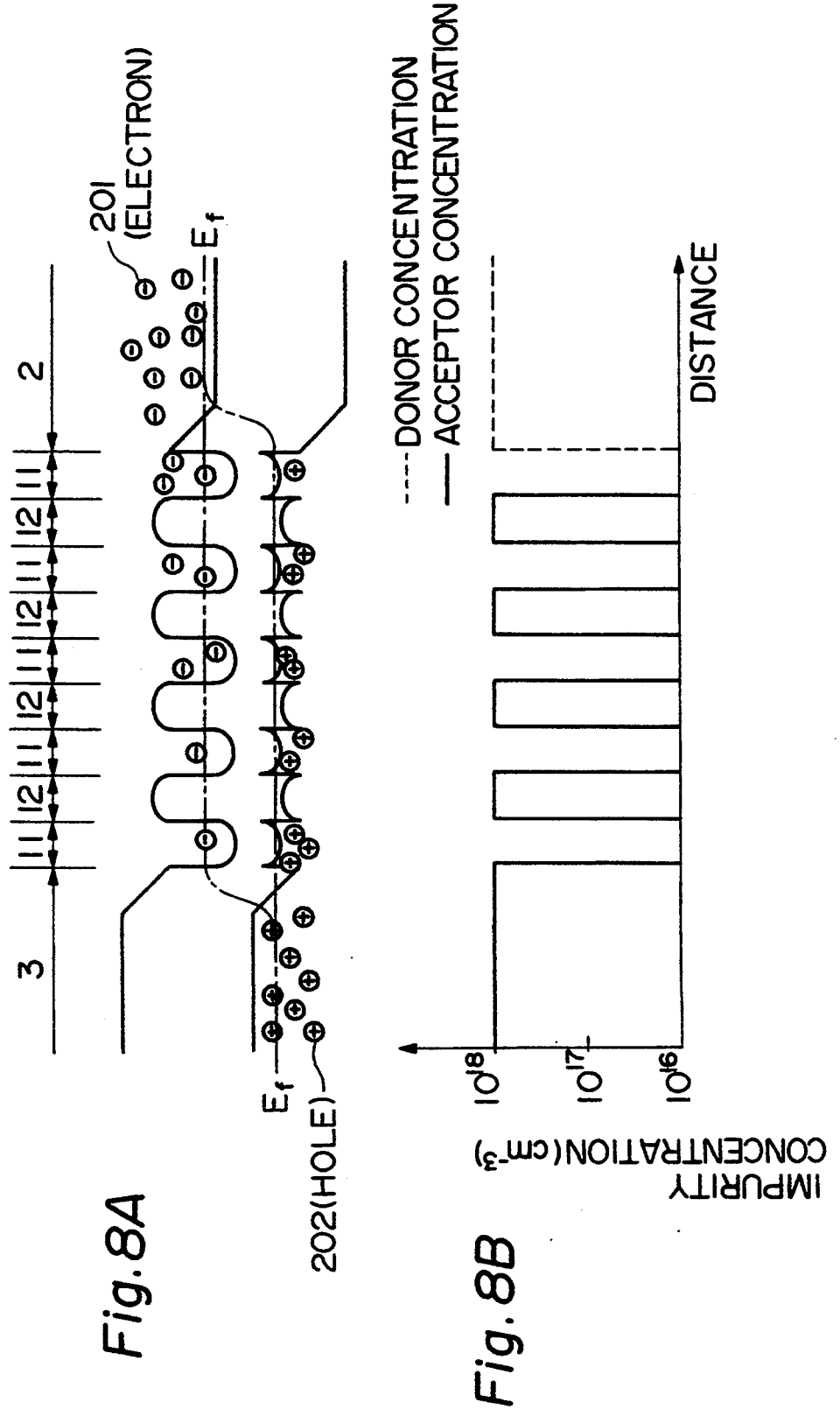

MULTIPLE QUANTUM WELL STRUCTURE AND SEMICONDUCTOR DEVICE USING THE SAME

BACKGROUND OF THE INVENTION

The present invention relates to a quantum well structure composed of quantum well layers and barrier layers of an energy gap larger than that of the quantum well layers and a semiconductor device employing such a quantum well structure.

On account of the progress of thin film growth techniques in recent years, it is now possible to obtain, with ease and excellent controllability, what is called a multiple quantum well structure wherein thin films of two materials of different energy gaps are alternately laminated to thicknesses substantially equal to the de Broglie's wavelength of electrons. The multiple quantum well confines electrons or holes in the thin films through utilization of the difference in energy gap between the two materials, and hence produces a variety of quantum effects unobtainable with bulk crystals, and the effects are now being widely applied to devices.

It has been made clear, theoretically and experimentally, that a semiconductor laser using the multiple quantum well structure, for example, has low oscillation threshold current density and is less temperature-dependent than a conventional double hereto laser and suitable for a narrow spectrum operation, a high-speed operation and a high output operation, and hence has excellent characteristics.

It has also been ascertained that selective doping of an impurity into only the barrier layer in the multiple quantum well structure suppresses scattering of carriers confined in the quantum well layer by impurity atoms and thus would contribute to further enhancement of device characteristics. For example, an HEMT is a device which utilizes such selective doping, and in this instance, carriers from the barrier layer doped with an n-type impurity are stored in a non-impurity-doped active layer to provide high electron mobility. Furthermore, it has been reported that the application of the selectively-doped multiple quantum well structure would increase a differential gain by p-type impurity doping and decrease a threshold current by n-type impurity doping (Uomi et al., Skingaku Giho, OQD86-66, for example).

The present invention is provided to solve the problems of the prior art which will hereinbelow be described in respect of drawings. FIG. 7 is a schematic diagram of an AlGaAs semiconductor laser which is a typical example of conventional selective-doping multiple quantum well semiconductor lasers. On an n-type GaAs substrate 1 there are laminated an n-type AlGaAs layer 2 serving as an n-type clad layer, selectively doped multiple quantum well layers 11 and 12 serving as active layers, a p-type AlGaAs layer 3 serving as a p-type clad layer and a p-type GaAs cap layer 4 for contact with an electrode, and electrodes 101 and 102 for current injection use are formed on the top and underside of the assembly, respectively. For laterial mode stability and current contraction a semi-insulating AlGaAs layer 5 is used to form a buried stripe geometry. FIGS. 8A and 8B show the band diagrams and impurity concentration in the vicinity of the active layers of the laser. Four p-type AlGaAs barrier layers 12 and five non-doped quantum well layers 11 are alternately laminated into the active layers. Each barrier layer 12 is doped with Be which is a p-type impurity (i.e. an acceptor), with a uniform concentration ($1 \times 10^{18} cm^{-3}$). The p-type impurity ions (Be−) bend the energy bands of the barrier layers and the quantum well layers 11. Electrons 201 injected via the electrode 102 are injected from the n-type AlGaAs layer 2 into the quantum well layers 11, wherein they are recombined with holes 202, thereby emitting photons. At this time, since the electrons 201 are injected into the quantum well layers 11 according to their potential difference, the farther the electrons 201 go away from the n-type AlGaAs clad layer 2, the more barrier layers 12 they go over and the higher energy they have. The energy distribution of electrons is based on the Fermi distribution function, and since the distribution decreases with an increase in the energy of electrons, the number of electrons 201 injected into the respective quantum well layer 11 decreases with an increase in the distance of the quantum well layer from the n-type AlGaAs clad layer 2. On the other hand, the holes 202 which are emitted by the ionization of Be doped in the barrier layers 12 are localized in the quantum well layers, and for the same reason as given above in the case of the injected electrons, the distribution of holes which are injected via the electrode 101 into the quantum well layers 11 from the p-type AlGaAs clad layer 3 has such a tendency that the number of holes injected into the respective quantum well layer decreases with an increase in the distance from the p-type AlGaAs clad layer 3 (i.e. a decrease in the distance from the n-type AlGaAs clad layer 2). Thus, the distributions of the electrons 201 and the holes 202 are opposite in tendency to each other.

For the reasons given above, this structure has shortcomings that when the number of quantum well layers is large, it is difficult to distribute carriers injected from the outside uniformly throughout the entire multiple quantum well structure, and that the light emitting efficiency is low because the distributions of injected electrons and holes have opposite tendencies.

SUMMARY OF THE INVENTION

An object of the present invention is to provide a multiple quantum well structure which permits substantially uniform injection of externally injected carriers into respective quantum well layers of multiple quantum wells and a semiconductor device employing such a multiple quantum well structure.

To attain the above-noted object, the multiple quantum well structure according to the present invention is formed by laminating at least two pairs of quantum well layers each having a thickness substantially equal to the de Broglie's wavelength of electrons and barrier layers of an energy gap greater than that of the quantum well layers, and the multiple quantum well structure is doped with at least one of p-type and n-type impurities in a manner to slope the energy band of the entire multiple quantum well structure so that carriers injected thereinto are distributed uniformly throughout it.

With such a construction, according to the present invention, the energy band structure of the entire multiple quantum well slopes in its entirety, permitting substantially uniform distribution of injected carriers (electrons and holes) throughout the multiple quantum well structure.

BRIEF DESCRIPTION OF THE DRAWINGS

The present invention will be described in detail below with reference to accompanying drawings, in which:

FIGS. 8A and 8B are energy band diagrams and an impurity concentration distribution diagram in the vicinity of an active layer of the prior art example depicted in FIG. 7.

PREFERRED EMBODIMENTS OF THE INVENTION

[Embodiment 1]

Figure 1:
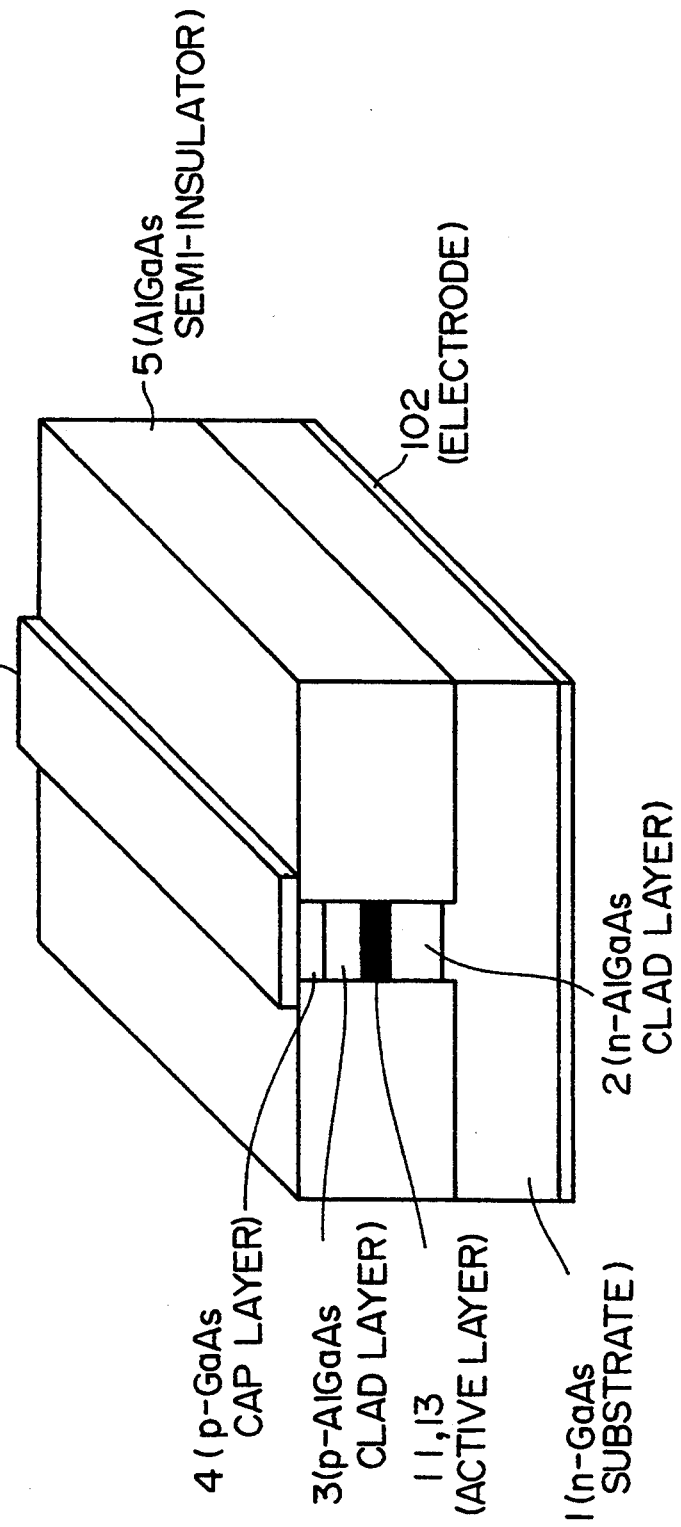
FIG. 1 is a perspective view illustrating a first embodiment of the present invention.
Figures 2A, 2B:
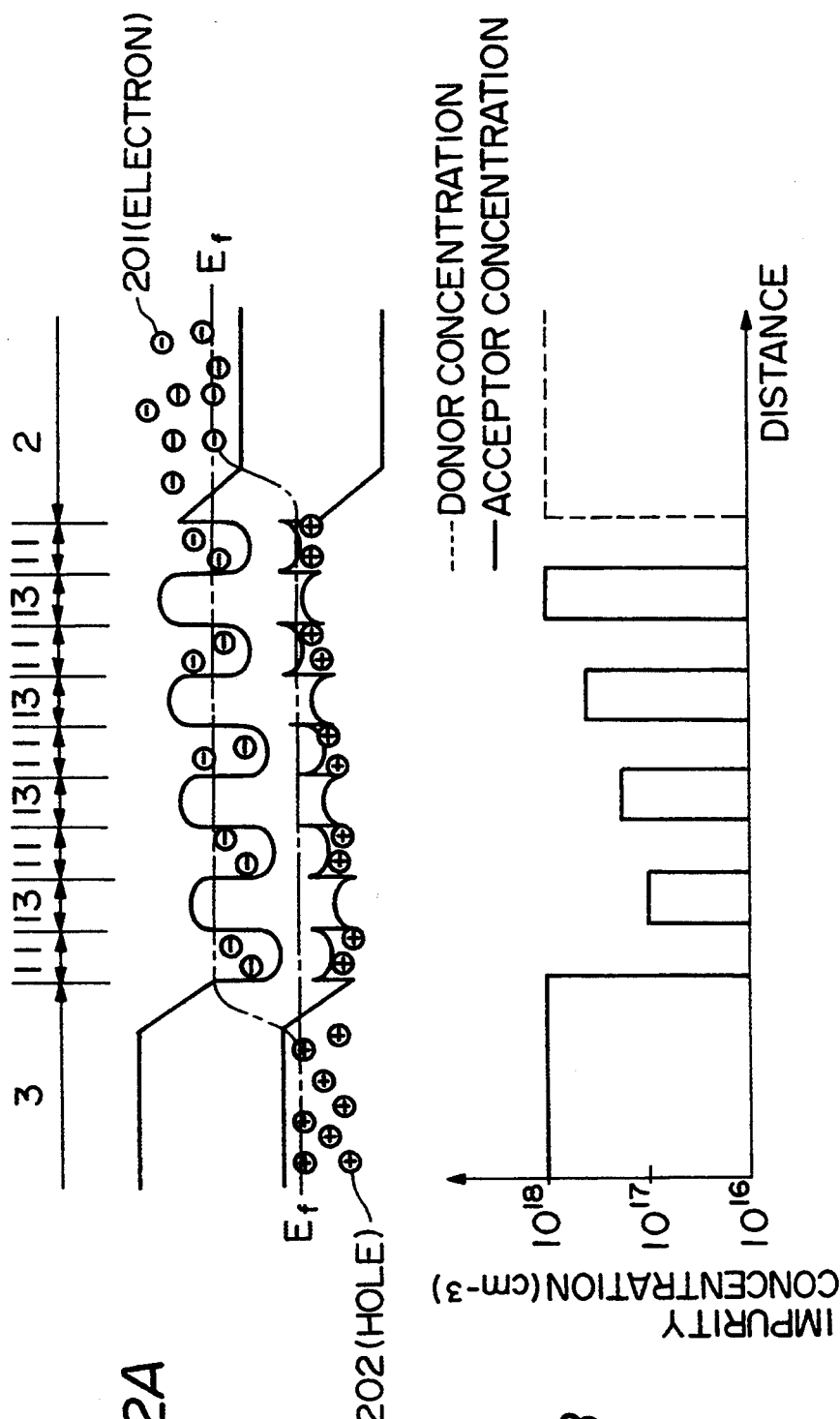
FIGS. 2A and 2B are energy band diagrams and an impurity concentration distribution diagram of the first embodiment.
Figure 7:
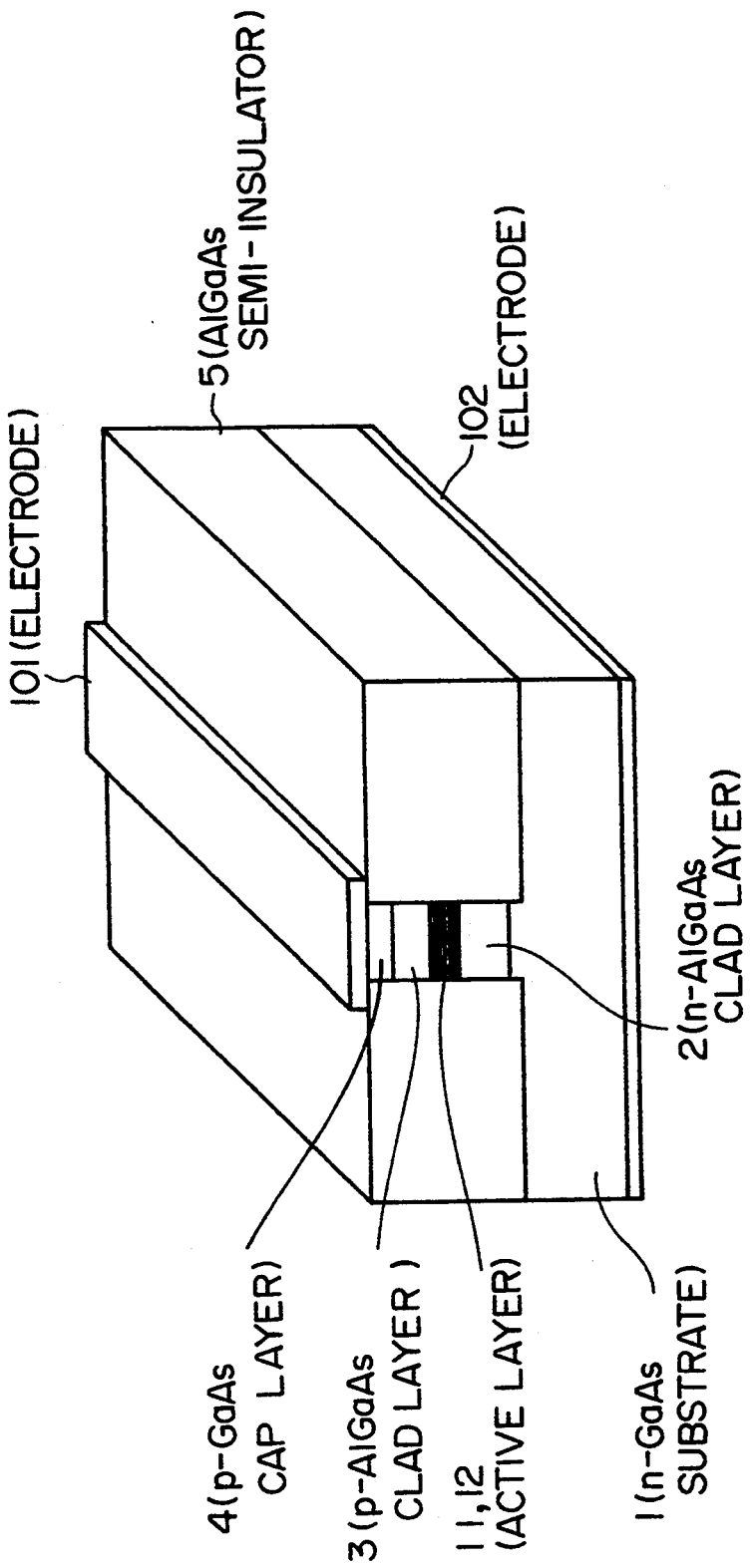
FIG. 7 is a perspective view showing an example of the construction of a conventional light emitting element.

FIGS. 1 and 2 are diagrammatic representations of an embodiment of a light emitting device employing the multiple quantum well structure according to the present invention. This embodiment differs from the prior art example of FIGS. 7 and 8 in that the concentration of beryllium (Be) doped, as an acceptor, into a four-layered barrier layer 13 is gradually increased from the p-type AlGaAs clad layer 3 toward the n-type AlGaAs clad layer 2 in an order which may, for example, be $1 \times 10^{17}$ cm$^{-3}$, $2 \times 10^{17}$ cm$^{-3}$, $5 \times 10^{17}$ cm$^{-3}$, $1 \times 10^{18}$ cm$^{-3}$. By this, the energy band of the entire multiple quantum well, which is composed of quantum well layer 11 and the barrier layer 13 and functions as an active layer, slopes upward from the p-type AlGaAs clad layer 3 to the n-type AlGaAs clad layer 2, allowing injected carriers to be distributed almost uniformly throughout the multiple quantum well structure due to the resulting potential gradient. In consequence, an overlap of the wave functions of electrons and holes increases, and hence the light emitting efficiency and the differential gain increase, permitting an excellent high-speed operation.

[Embodiment 2]

Figure 3:
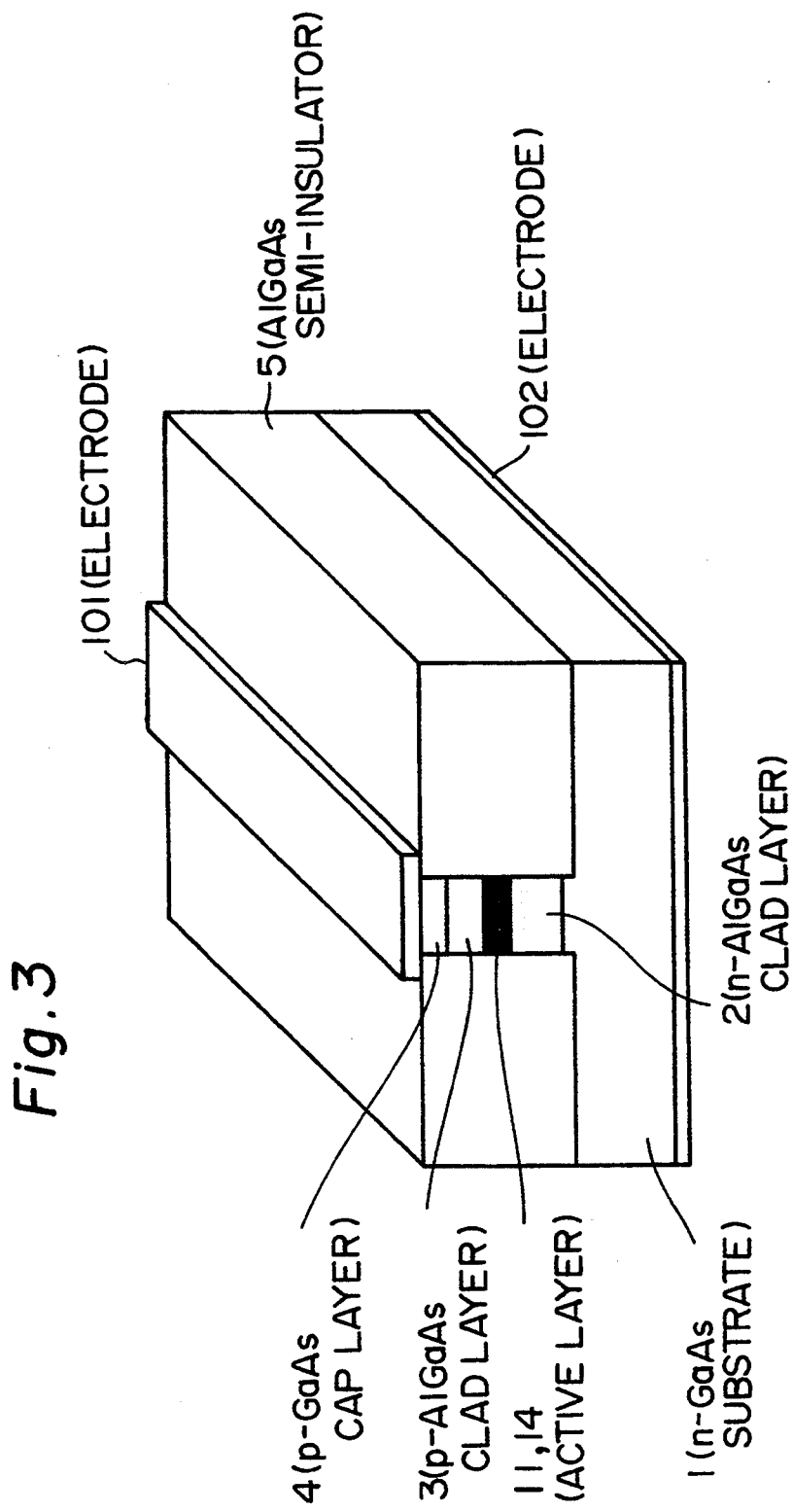
FIG. 3 is a perspective view illustrating a second embodiment of the present invention.
Figure 4A:
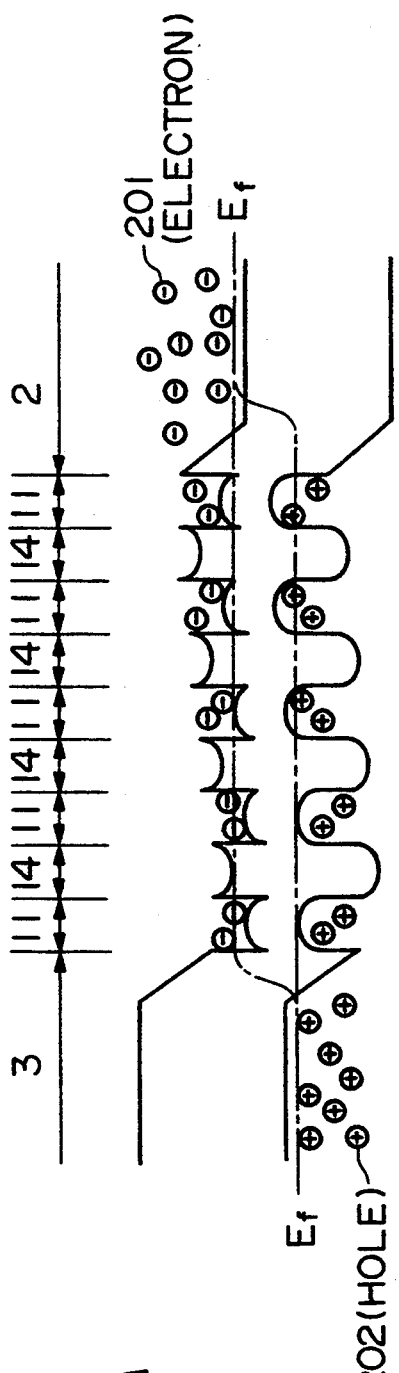
FIGS. 4A and 4B are energy band diagrams and an impurity concentration distribution diagram of the second embodiment.
Figure 4B:
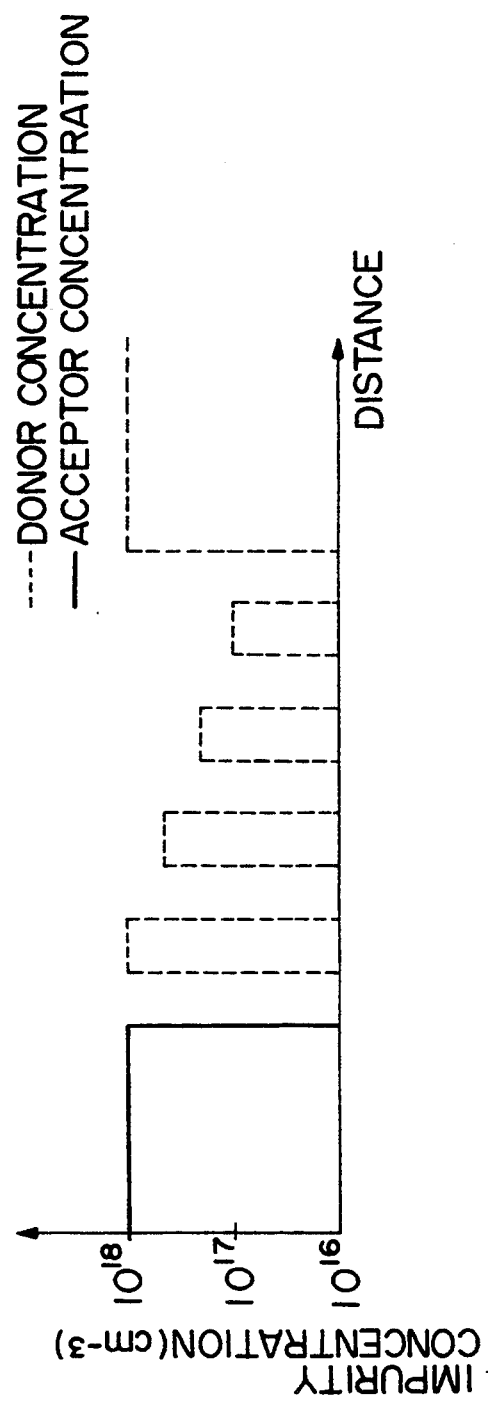

FIGS. 3 and 4 illustrate a second embodiment of the present invention. This embodiment differs from Embodiment 1 in that barrier layers 14 are doped with silicon (Si), an n-type impurity, instead of the beryllium (Be) which is a p-type impurity, and in that the silicon concentration is gradually decreased from the p-type AlGaAs clad layer 3 to the n-type AlGaAs clad layer 2 in the order, for example, $1 \times 10^{18}$ cm$^{-3}$ — $5 \times 10^{17}$ cm$^{-3}$ — $2 \times 10^{17}$ cm$^{-3}$ — $1 \times 10^{17}$ cm$^{-3}$. By the presence of n-type impurity ions (Si−) doped in the barriers 14, the energy bands of the barrier layers 14 and the quantum well layers 11 are curved in the direction opposite to that in Embodiment 1. Moreover, since electrons liberated by the ionization of the silicon are localized in the quantum well layers, the threshold current density decreases remarkably. By varying the concentration of the silicon doped in the barrier layers 14 as shown in FIG. 4B, the energy band of the entire multiple quantum well, which is formed by the quantum well layers 11 and the barrier layers 14 and functions as an active layer, slopes upward from the p-type AlGaAs clad layer 3 toward the n-type AlGaAs clad layer 2, and thus injected carriers are distributed substantially uniformly throughout the multiple quantum well structure due to the resulting potential gradient. This embodiment also provides the same results as those obtainable with Embodiment 1.

[Embodiment 3]

Figure 5:
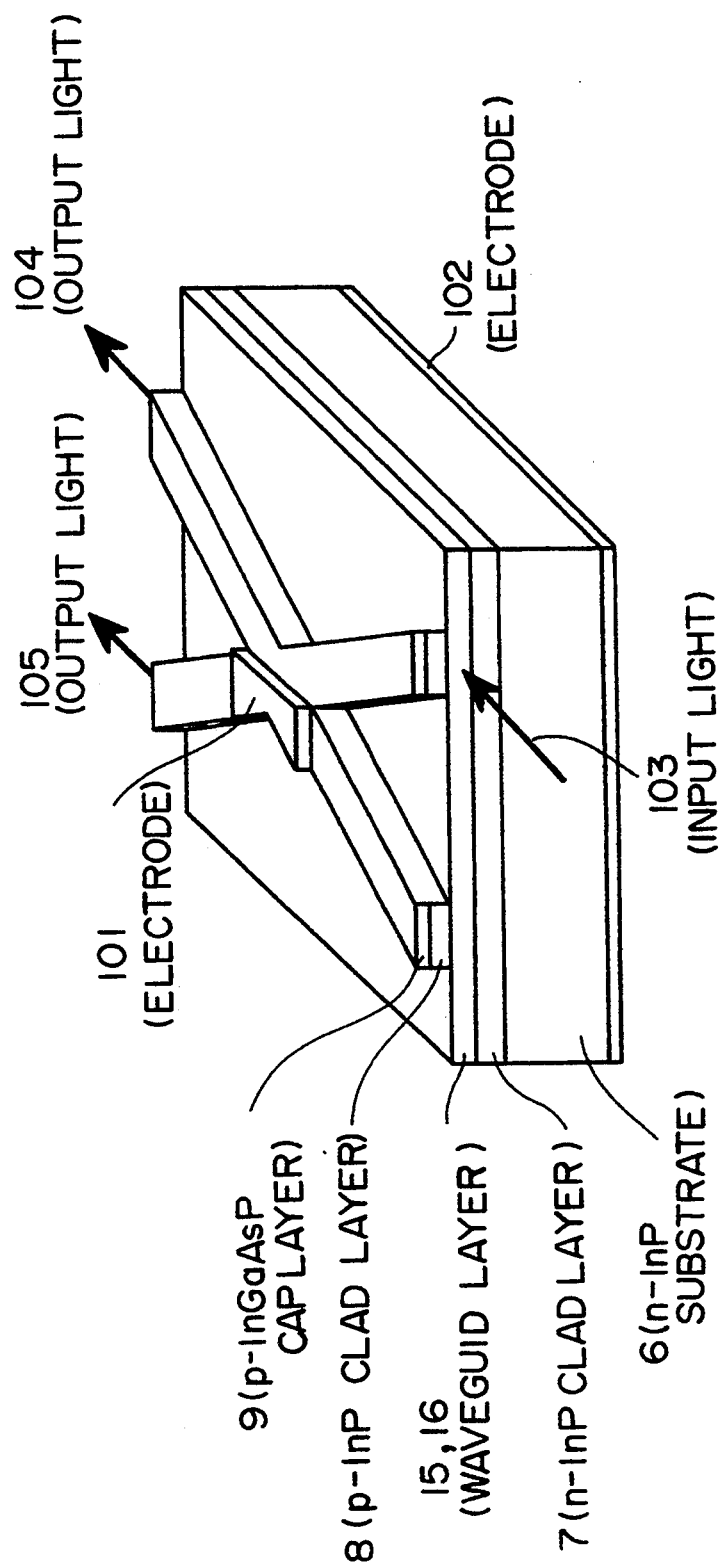
FIG. 5 is a perspective view illustrating a third embodiment of the present invention.
Figures 6A, 6B:
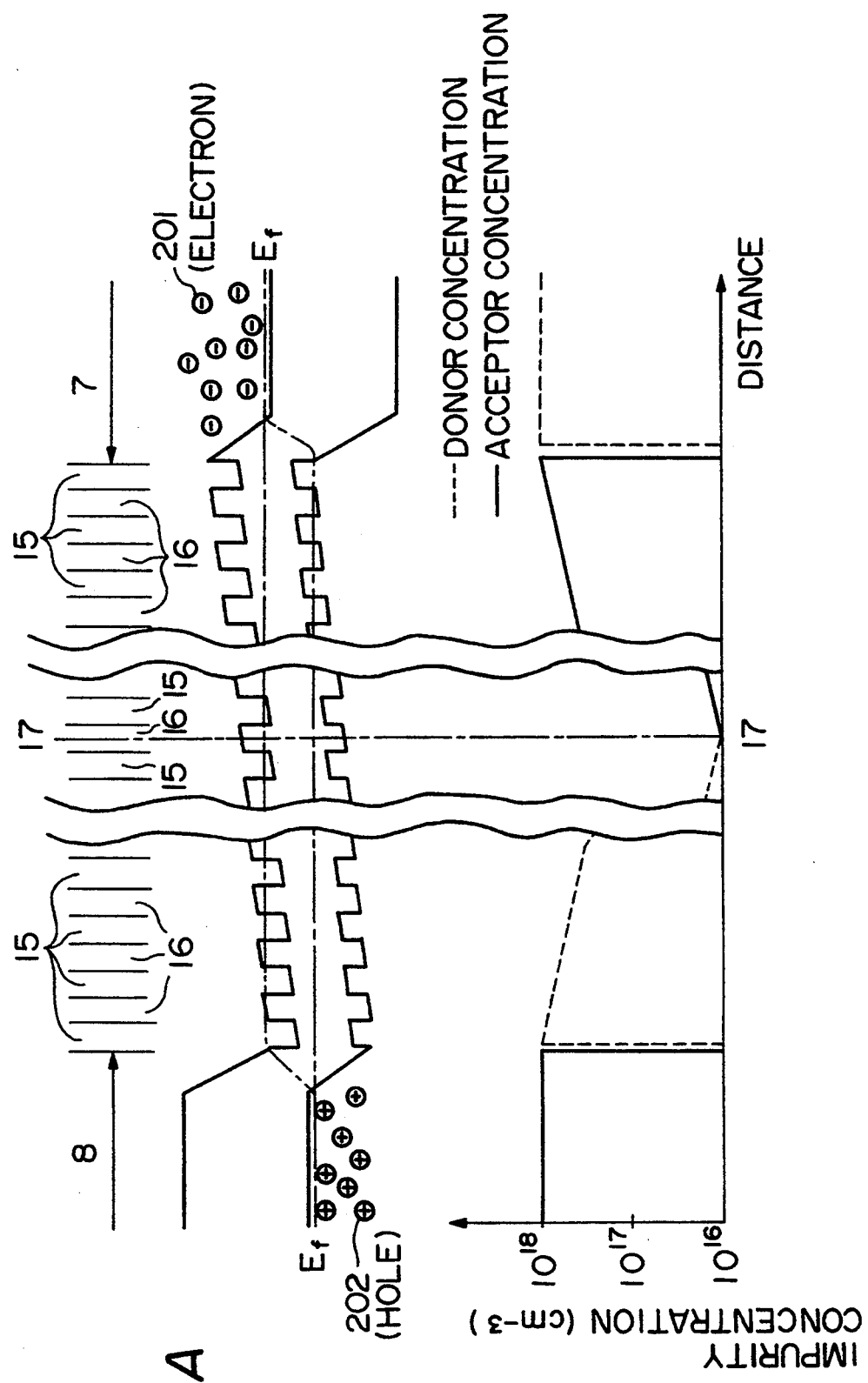
FIGS. 6A and 6B are energy band diagrams and an impurity concentration distribution diagram of the third embodiment.

FIG. 5 illustrates a third embodiment of the present invention, which is an optical switching device utilizing the multiple quantum well structure according to the invention. The optical switching device illustrated is identical in construction with ordinary X waveguide type optical switches except that its waveguide layer uses the multiple quantum well structure according to the present invention. On an n-type InP substrate 6 there are laminated an n-type InP clad layer 7 and waveguide layers 15 and 16, on which a p-type InP clad layer 8 and a p-type InGaAsP cap layer 9 for contact with an electrode are provided in an X-letter shape to form a ridge waveguide. When carriers are injected into the waveguide layers 15 and 16 from the electrode 101 in contact with one side area of the ridge intersecting part, the refractive indexes of the waveguide layers 15 and 16 decrease due to a plasma effect and guided input light 103 is totally refracted at the ridge intersection on account of the difference in refractive index between the waveguide layers and emitted as output light 104. When no carriers are injected, the input light 103 is guided intact and provided as output light 105. Thus, this device is an optical switch which controls the path of light by ON-OFF control of current. FIGS. 6A and 6B show energy bands and impurity concentration distribution of the device in the vicinity of its waveguide layers. In this embodiment, forty-nine InGaAsP barrier layers 16 and fifty InGaAs quantum well layers 15 are alternately laminated to form a multiple quantum well waveguide layer. In this type of optical switch, it is very important to form a waveguide layer whose refractive index is greatly changed by the injection of current, and the large number of quantum well layers is needed to meet this requirement. As depicted in FIG. 6B, the waveguide layer was doped with silicon, i.e. an n-type donor impurity, and beryllium, i.e. a p-type acceptor impurity, so that the silicon concentration would decrease continuously from $1 \times 10^{18}$ cm$^{-3}$ to $1 \times 10^{16}$ cm$^{-3}$ toward the center 17 of the waveguide layer from the p-type InP clad layer 3, whereas the beryllium concentration would increase continuously from $1 \times 10^{16}$ cm$^{-3}$ to $1 \times 10^{18}$ cm$^{-3}$ toward the n-type InP clad layer 7 from the center 17 of the waveguide layer. As a result, the energy band of the entire waveguide layer could be sloped so that injected carriers (electrons and holes) would be injected uniformly into the respective quantum well layers even if the number of well layers is large. This Embodiment also provides the same results as those obtainable with Embodiments 1 and 2, making it possible to fabricate an optical switch which undergoes a substantial change in the refractive index of the entire waveguide layer, consumes less operating current and has a large angle of intersection of the ridge waveguide.

While the above embodiments have been described to employ semiconductor substrates of the InP and GaAs systems, other materials can be also used for the present invention without any difficulty. Although the present invention has been described as being applied to a semiconductor laser and an optical switch, the invention is also applicable to high-speed transistors and similar electron devices as well as a light emitting diode and a photodetector.

As described above in detail, the present invention permits substantially uniform injection of carriers from the outside into respective quantum well layers forming a multiple quantum well structure. In particular, in the cases of a light emitting device, a photodetector, an electron device, etc., uniform carrier injection into a multiple quantum well formed by a large number of layers or a multiple quantum well of a large barrier potential is requisite for significant improvement of their characteristics. Thus, the present invention is of great utility.

What we claim is:

1. A multiple quantum well structure formed by laminating at least two sets of quantum well layers each having a thickness substantially equal to the de Brogie's wave-length and barrier layer each having an energy gap greater than that of each of the quantum well layers, the multiple quantum well structure having p-type and n-type semiconductor layers disposed to sandwich the multiple quantum well structure therebetween,
  characterized in that said multiple quantum well structure is doped with at least either one of p-type and n-type impurities so that the energy band of said entire multiple quantum well structure slopes upward from the p-type semiconductor layer to the n-type semiconductor layer, effectively making possible substantially uniform distribution of injected carriers throughout it.

2. A multiple quantum well structure formed by laminating at least two sets of quantum well layers each having a thickness substantially equal to the de Brogie's wave-length and barrier layers each having an energy gap greater than that of each of the quantum well layers, said multiple quantum well structure having p-type and n-type semiconductor layers disposed to sandwich the multiple quantum well structure therebetween,
  characterized in that said multiple quantum well structure is doped with at least either one of p-type and n-type impurities so that the energy band of said entire multiple quantum well structure slopes upward from the p-type semiconductor layer to the n-type semiconductor layer, permitting substantially uniform distribution of injected carriers throughout it, and only its barrier layers are doped with at least either one of p-type or n-type impurities so that the energy band of the entire multiple quantum well structure slopes therein.

3. A multiple quantum well structure formed by laminating at least two sets of quantum well layers each having a thickness substantially equal to the de Broglie's wave-length and barrier layers each having an energy gap greater than that of each of the quantum well layers, said multiple quantum well structure having p-type and n-type semiconductor layers disposed to sandwich the multiple quantum well structure therebetween,
  characterized in that said multiple quantum well structure is doped with at least either one of p-type or n-type impurities so that the energy band of said entire multiple quantum well structure slopes upward from the p-type semiconductor layer to the n-type semiconductor layer, permitting substantially uniform distribution of injected carders throughout it,
  and only said well layers are doped with at least either one of p-type or n-type impurities so that the energy band of the entire multiple quantum well structure slopes therein.

* * * * *